United States Patent
Kaneko et al.

(10) Patent No.: US 12,512,313 B2
(45) Date of Patent: Dec. 30, 2025

(54) METHOD OF FORMING LOW-K MATERIAL LAYER WITH HIGH-FREQUENCY POWER, STRUCTURE INCLUDING THE LAYER, AND SYSTEM FOR FORMING SAME

(71) Applicant: ASM IP Holding B.V., Almere (NL)

(72) Inventors: Chie Kaneko, Tama (JP); Ippei Yanagisawa, Sagamihara (JP); Yu Min Huang, Tama (JP)

(73) Assignee: ASM IP Holding B.V., Almere (NL)

( * ) Notice: Subject to any disclaimer, the term of this patent is extended or adjusted under 35 U.S.C. 154(b) by 453 days.

(21) Appl. No.: 18/088,041

(22) Filed: Dec. 23, 2022

(65) Prior Publication Data
US 2023/0207308 A1   Jun. 29, 2023

Related U.S. Application Data

(60) Provisional application No. 63/294,157, filed on Dec. 28, 2021.

(51) Int. Cl.
*H01L 21/02* (2006.01)
*H01J 37/32* (2006.01)

(52) U.S. Cl.
CPC .. *H01L 21/02216* (2013.01); *H01L 21/02211* (2013.01); *H01L 21/02274* (2013.01); *H01J 37/32091* (2013.01)

(58) Field of Classification Search
None
See application file for complete search history.

(56) References Cited

U.S. PATENT DOCUMENTS

| | | | |
|---|---|---|---|
| 6,287,990 B1 * | 9/2001 | Cheung | H01L 21/76834 427/255.6 |
| 6,602,800 B2 | 8/2003 | Matsuki | |
| 6,737,366 B2 | 5/2004 | Matsuki | |
| 6,740,602 B1 | 5/2004 | Hendriks | |
| 6,767,836 B2 | 7/2004 | San | |
| 6,818,570 B2 | 11/2004 | Tsuji | |
| 6,825,130 B2 | 11/2004 | Todd | |
| 6,849,561 B1 | 2/2005 | Goundar | |
| 6,905,978 B2 | 6/2005 | Tsuji | |
| 6,905,981 B1 | 6/2005 | Todd | |
| 6,949,456 B2 | 9/2005 | Kumar | |
| 7,064,088 B2 | 6/2006 | Hyodo | |
| 7,091,133 B2 | 8/2006 | Goundar | |
| 7,148,154 B2 | 12/2006 | Hyodo | |
| 7,229,935 B2 | 6/2007 | Fukazawa | |
| 7,354,852 B2 | 4/2008 | Matsushita | |
| 7,418,921 B2 | 9/2008 | Tsuji | |
| 7,560,144 B2 | 7/2009 | Fukazawa | |
| 7,582,575 B2 | 9/2009 | Fukazawa | |
| 7,585,789 B2 | 9/2009 | Hyodo | |
| 7,655,577 B2 | 2/2010 | Hyodo | |

(Continued)

*Primary Examiner* — Asok K Sarkar
(74) *Attorney, Agent, or Firm* — Snell & Wilmer L.L.P.

(57) ABSTRACT

Methods and systems for forming a low-k material layer on a surface of a substrate and structures and devices formed using the method or system are disclosed. Exemplary methods include providing a substrate within a reaction chamber of a reactor system, providing one or more precursors to the reaction chamber, and providing high frequency, high plasma power to polymerize the one or more precursors to form dense low-k material with desired properties.

17 Claims, 12 Drawing Sheets

(56) References Cited

U.S. PATENT DOCUMENTS

| | | |
|---|---|---|
| 7,718,544 B2 | 5/2010 | Tsuji |
| 7,807,566 B2 | 10/2010 | Tsuji |
| 7,955,650 B2 | 6/2011 | Tsuji |
| 8,003,174 B2 | 8/2011 | Fukazawa |
| 8,053,036 B2 | 11/2011 | Takahashi |
| 8,080,282 B2 | 12/2011 | Fukazawa |
| 8,551,892 B2 | 10/2013 | Nakano |
| 8,765,233 B2 | 7/2014 | Fukazawa |
| 9,190,263 B2 | 11/2015 | Ishikawa |
| 10,354,844 B2 | 7/2019 | Kondo |
| 10,526,704 B2 | 1/2020 | Nonaka |
| 2014/0141542 A1* | 5/2014 | Kang ................ H01L 22/20 |
| | | 438/761 |
| 2020/0109484 A1 | 4/2020 | Yanagisawa |
| 2021/0257213 A1 | 8/2021 | Yoshiyuki |
| 2021/0265158 A1 | 8/2021 | Kaneko |
| 2022/0037147 A1* | 2/2022 | Kim ............... H01L 21/31111 |

\* cited by examiner

METHOD OF FORMING LOW-K MATERIAL LAYER WITH HIGH-FREQUENCY POWER, STRUCTURE INCLUDING THE LAYER, AND SYSTEM FOR FORMING SAME

CROSS-REFERENCE TO RELATED APPLICATIONS

This application claims priority to U.S. Provisional Patent Application Ser. No. 63/294,157 filed Dec. 28, 2021 titled METHOD OF FORMING LOW-K MATERIAL LAYER WITH HIGH-FREQUENCY POWER, STRUCTURE INCLUDING THE LAYER, AND SYSTEM FOR FORMING SAME, the disclosure of which is hereby incorporated by reference in its entirety.

FIELD OF INVENTION

The present disclosure generally relates to methods of forming layers and structures suitable for use in the manufacture of electronic devices. More particularly, examples of the disclosure relate to methods of forming low dielectric constant material layers, to structures and devices including such layers, and to systems for performing the methods and/or forming the structures and/or devices.

BACKGROUND OF THE DISCLOSURE

During the manufacture of devices, such as semiconductor devices, it is often desirable to deposit a low dielectric constant (low-k) material—e.g., to fill features (e.g., trenches or gaps)—on the surface of a substrate. By way of examples, low-k material can be used as an intermetal dielectric layer on patterned metal features, a gap fill in back-end-of-line processes, insulating layers, or for other applications.

Recently, techniques to deposit low-k dielectric materials that include carbon and silicon have been developed. While such materials exhibit some desirable properties, the materials can be susceptible to carbon loss during subsequent processing, such as plasma etch processes. The carbon loss can lead to an undesired shift in the dielectric constant of the material. Attempts to produce low-k material with desired properties, such as reduced dielectric constant shift, can often result in a lower processing throughput.

There is thus a general desire for methods of forming low-k material with desired properties at a relatively high throughput. Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

Various embodiments of the present disclosure relate to methods of forming a low-k material layer on a surface of a substrate, to structures including the low-k material layer, and to systems for performing the methods and/or forming the structures. While the ways in which various embodiments of the present disclosure address drawbacks of prior methods and structures are discussed in more detail below, in general, exemplary embodiments of the disclosure use a relatively high-frequency and/or high power during deposition to form low-k material layers that are less susceptible to carbon loss and dielectric constant shift, while achieving a relatively high throughput.

In accordance with various embodiments of the disclosure, methods of forming a low-k material layer on a surface of a substrate are provided. Exemplary methods include the steps of providing a substrate within a reaction chamber of a reactor system, providing one or more precursors to the reaction chamber, and providing first plasma power to polymerize the one or more precursors within the reaction chamber to form low-k material. A frequency of the first plasma power can be between about 27 MHz and about 100 MHz or between about 27 MHz and about 60 MHz. In accordance with further example, the power is greater than 2 kW or is between about 2 kW and about 5 kW. Exemplary methods can further include providing a second plasma power to manipulate mechanical properties of the low-k material. A frequency of the second plasma power can be between about 400 kHz and about 500 kHz. The second plasma power can be between about 10 W and about 300 W. A temperature (e.g., a substrate temperature) within the reaction chamber during the step of providing one or more precursors to the reaction chamber can be between about 200° C. and about 450° C. or between about 300° C. and about 400° C. A pressure within the reaction chamber during the step of providing one or more precursors to the reaction chamber can be between 1 torr and about 20 torr or between about 2 torr and about 10 torr. The one or more precursors can include a compound comprising one or more of Si—C—Si and Si—O—Si bonds. A capacitively-coupled power source can be used to provide the first plasma power and/or the second plasma power. Exemplary methods can also include a step of providing an inert gas to the reaction chamber, wherein the step of providing the inert gas overlaps in time with the step of providing one or more precursors to the reaction chamber and/or providing the first or second plasma power.

In accordance with yet further exemplary embodiments of the disclosure, a structure is formed, at least in part, according to a method described herein. The structure can include a low-k material layer. A dielectric constant of the dielectric material layer can be less than 3 and/or the low-k material layer can exhibit relatively little shift when the low-k material layer is exposed to an oxygen plasma.

In accordance with further examples of the disclosure, a device can be formed using a method and/or include a structure as described herein.

In accordance with yet further exemplary embodiments of the disclosure, a system is provided for performing a method and/or for forming a structure as described herein.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
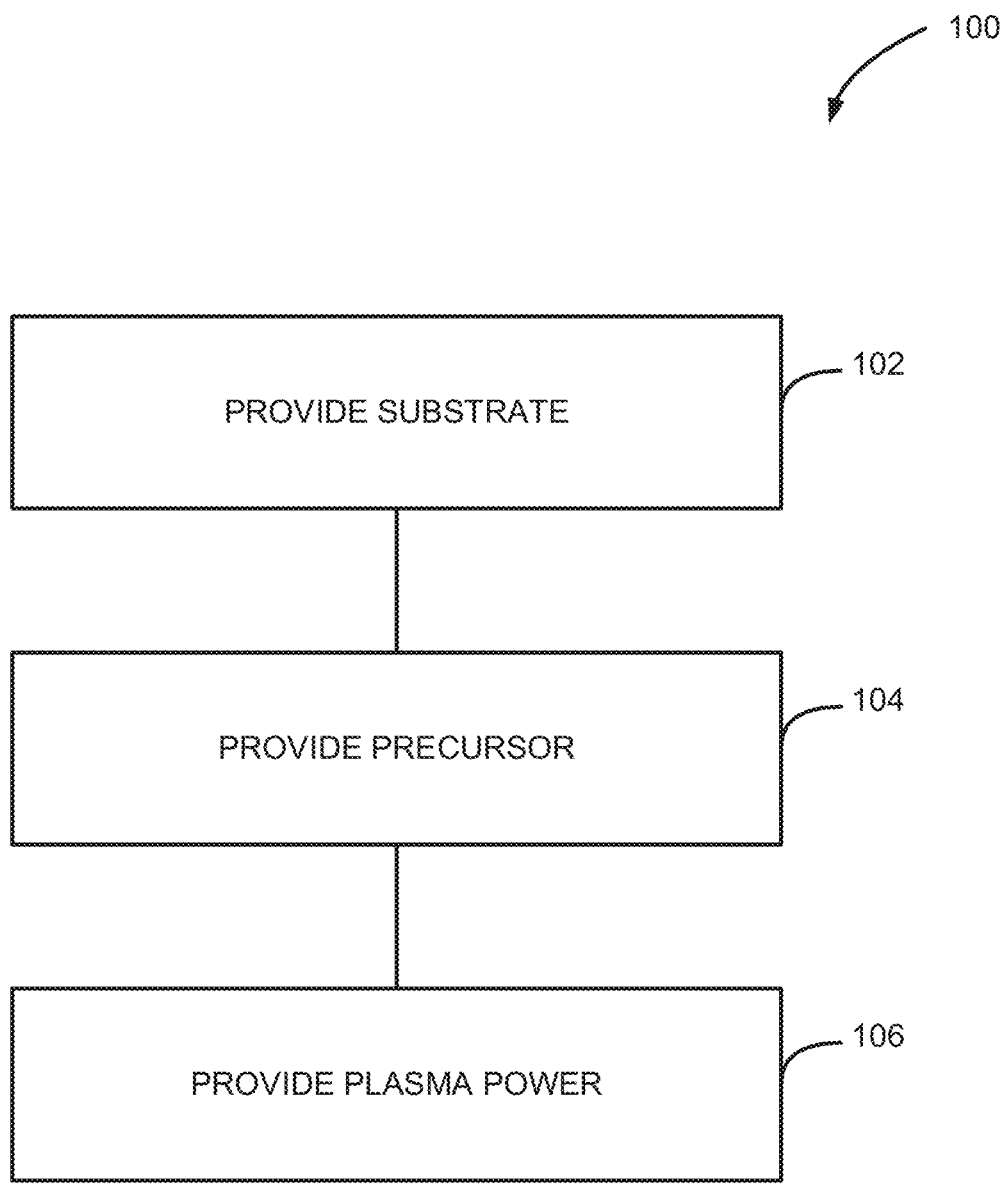
FIG. 1 illustrates a method in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of forming low-k material layers on surfaces of substrates, to methods of forming structures and devices, to structures and devices formed using the methods, and to systems for performing the methods and/or forming the structures and devices. By way of examples, the methods described herein can be used to fill features, such as gaps (e.g., trenches or vias) on a surface of a substrate with the low-k material. The terms gap and recess can be used interchangeably.

In this disclosure, "gas" can refer to material that is a gas at normal temperature and pressure, a vaporized solid and/or a vaporized liquid, and may be constituted by a single gas or a mixture of gases, depending on the context. A gas other than a process gas, i.e., a gas introduced without passing through a gas distribution assembly, such as a showerhead, other gas distribution device, or the like, may be used for, e.g., sealing a reaction space, which includes a seal gas, such as a rare gas. In some cases, such as in the context of deposition of material, the term "precursor" can refer to a compound that participates in the chemical reaction that produces another compound, and particularly to a compound that constitutes a film matrix or a main skeleton of a film. The term "inert gas" refers to a gas that does not take part in a chemical reaction to an appreciable extent and/or a gas that excites a precursor (e.g., to facilitate polymerization of the precursor) when, for example, power (e.g., VHF power) is applied, but it may not become a part of a film matrix to an appreciable extent. Exemplary inert gases include argon, helium, nitrogen, and neon, and any mixture thereof.

As used herein, the term "substrate" can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as Group III-V or Group II-VI semiconductors, and can include one or more layers overlying or underlying the bulk material. Further, the substrate can include various features, such as gaps (e.g., recesses or vias), lines or protrusions, such as lines having gaps formed therebetween, and the like formed on or within at least a portion of a layer or bulk material of the substrate. By way of examples, one or more features can have a width of about 10 nm to about 100 nm, a depth or height of about 30 nm to about 1,000 nm, and/or an aspect ratio of about 1:1, 3:1, 10:1, 100:1, or more.

In some embodiments, "film" refers to a layer extending in a direction perpendicular to a thickness direction. In some embodiments, "layer" refers to a material having a certain thickness formed on a surface and can be a synonym of a film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers. The layer or film can be continuous—or not. Further, a single film or layer can be formed using one or more deposition cycles. In some cases, formation of the film or layer does not include an additional curing step.

As used herein, the term "low-k material layer" or "low-k material," can refer to material whose dielectric constant is less than the dielectric constant of silicon dioxide or less than 4.0 or less than 3.8 or between about 2.5 and about 3.

As used herein, the term "structure" can refer to a partially or completely fabricated device structure. By way of examples, a structure can be a substrate or include a substrate with one or more layers and/or features formed thereon.

In this disclosure, "continuously" can refer to without breaking a vacuum, without interruption as a timeline, without any material intervening step, without changing conditions, immediately thereafter, as a next step, or without an intervening discrete physical or chemical structure between two structures other than the two structures in some embodiments and depending on the context.

A flowability (e.g., an initial flowability) can be determined as follows:

TABLE 1

| bottom/top ratio (B/T) | Flowability |
|---|---|
| 0 < B/T < 1 | None |
| 1 ≤ B/T < 1.5 | Poor |
| 1.5 ≤ B/T < 2.5 | Good |
| 2.5 ≤ B/T < 3.5 | Very good |
| 3.5 ≤ B/T | Extremely good | where B/T refers to a ratio of thickness of film deposited at a bottom of a recess to thickness of film deposited at a top surface where the recess is formed, before the recess is filled. Typically, the flowability is evaluated using a wide recess having an aspect ratio of about 1:1 or less, since generally, the higher the aspect ratio of the recess, the higher the B/T ratio becomes. The B/T ratio generally becomes higher when the aspect ratio of the recess is higher. As used herein, a "flowable" film or material exhibits good or better flowability.

As set forth in more detail below, flowability of material can be temporarily obtained when one or more precursors are polymerized by, for example, excited species formed using a plasma. The resultant polymer material can exhibit temporarily flowable behavior. When a deposition step is complete and/or after a short period of time (e.g., about 3.0 seconds), the film may no longer be flowable, but rather becomes solidified.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments. In some cases, percentages indicate herein can be relative or absolute percentages.

Turning now to the figures, FIG. 1 illustrates a method 100 of forming a low-k material layer on a surface of a substrate in accordance with exemplary embodiments of the disclosure. Method 100 includes the steps of providing a substrate within a reaction chamber (step 102), providing one or more precursors to the reaction chamber (step 104, and providing a first plasma power to polymerize the one or more precursors within the reaction chamber to form low-k material (step 106).

During step 102, a substrate is provided into a reaction chamber of a gas-phase reactor. In accordance with examples of the disclosure, the reaction chamber can form part of a chemical vapor deposition reactor, such as a plasma-enhanced chemical vapor deposition (PECVD) reactor or plasma-enhanced atomic layer deposition (PEALD) reactor. For example, a capacitively coupled plasma (CCP) excitation, and particularly a very high frequency (VHF) CCP excitation of an inert gas can be used.

Various steps of methods described herein can be performed within a single reaction chamber, such as a reaction chamber of a module or cluster tool. An exemplary reactor is described in more detail below in connection with FIG. 11.

During step 102, the substrate can be brought to a desired temperature and/or the reaction chamber can be brought to a desired pressure, such as a temperature and/or pressure suitable for subsequent steps. By way of examples, a temperature (e.g., of a substrate or a substrate support) within a reaction chamber can be less than or equal to 450° C. or between 200° C. and about 450° C. or between about 300° C. and about 400° C.

During providing one or more precursors to the reaction chamber step 104, one or more precursors for forming low-k material are introduced into the reaction chamber. Exemplary precursors can include a compound comprising carbon and/or silicon. For example, the one or more precursors can include a compound comprising one or more of Si—C—Si and Si—O—Si bonds. The one or more precursors can comprise a compound comprising a cyclic structure. The cyclic structure can include silicon. The cyclic structure can include silicon and oxygen. The one or more precursors can include a compound comprising an organosilicon compound. By way of particular examples, the one or more precursors comprise one or more of dimethyldimethoxysilane (DMDMOS), octamethylcyclotetrasiloxane (OMCTS), tetramethylcyclotetrasiloxane (TMCTS), octamethoxydodecasiloxane (OMODDS), octamethoxycyclioiloxane, diethoxymethylsilane (DEMS), dimethoxymethylsilane (DMOMS), phenoxydimethylsilane (PODMS), dimethyldioxosilylcyclohexane (DMDOSH), 1,3-dimethoxytetramethyldisiloxane (DMOTMDS), dimethoxydiphenylsilane (DMDPS), and dicyclopentyldimethoxysilane (DcPDMS).

In some cases, the at least one of the one or more precursors comprises a ring (or cyclic) structure comprising a chemical formula represented by $-(Si(R_1, R_2)-O)_n-$, where n ranges from about 3 to about 10. In accordance with examples, $n=4$ and $R_1=R_2=CH_3$; in accordance with further examples, $n=4$, $R_1=H$, and $R_2=CH_3$.

In accordance with further examples of the disclosure, at least one of the one or more precursors comprises a linear structure comprising a chemical formula represented by $R_3-(Si(R_1, R_2)_m-O_{(m-1)})-R_4$, where m can range from about 1 to about 7. In accordance with examples, $m=1$, $R_1=R_2=CH_3$, and $R_3=R_4=OCH_3$; or $m=2$, $R_1=R_2=CH_3$, and $R_3=R_4=OCH_3$; or $m=2$, $R_1=C_3H_6-NH_2$, $R_2=CH_3$, and $R_3=R_4=CH_3$.

A flowrate of the one or more precursors to the reaction chamber can vary according to other process conditions, reactor size, substrate size, and the like. By way of examples, the flowrate can be from about 100 sccm to about 3,000 sccm or about 100 sccm to about 300 sccm. Similarly, a duration of each step of providing a precursor to the reaction chamber can vary, depending on various considerations.

During steps 104 and/or 106, one or more inert gases can be provided to the reaction chamber. The one or more inert gases can be flowed to the reaction chamber at the same time or overlapping in time with the step of providing one or more precursors to the reaction chamber. Use of argon during steps 104/106 is thought to increase hardness of the low-k material layer.

A temperature within the reaction chamber during step 104 can be as described above in connection with step 102. A pressure within the reaction chamber during step 104 can be between about 1 torr and about 20 torr or between about 2 torr and about 10 torr. Additional exemplary process conditions are provided below.

During step 106, the one or more precursors provided to the reaction chamber during step 104 are polymerized into the initially viscous, flowable material using excited species. The initially viscous, flowable material can become solid material—e.g., through further reaction with excited species. Steps 104 and 106 can include, for example, a PECVD, PEALD, or PE cyclical CVD process.

During step 106, a plasma can be generated using a direct plasma system, described in more detail below, and/or using an indirect or remote plasma system. A first power used to generate the plasma during step 106 to polymerize the one or more precursors can be greater than 2 kW or between about between about 2 kW and about 5 kW for a 300 mm cross section (e.g., diameter) substrate. The plasma power can be suitably scaled based on a cross-sectional dimension of the substrate. A frequency of the power can range from wherein a frequency of the first plasma power is between about 27 MHz and about 100 MHz or between about 27 MHz and about 60 MHz. In some cases, a frequency of power for step 106 can include a high RF frequency (e.g., over 27 MHz or between 27 and 60 MHz) and a low RF frequency (e.g., less than 500 kHz or between about 400 kHz and about 500 kHz). The second/lower frequency power can be applied to either an anode or a cathode of a plasma generation system. The second frequency can be used to manipulate mechanical properties of the low-k material, such as hardness, etch rate, and the like. The second plasma power can be between about 10 W and about 300 W.

Figure 12:
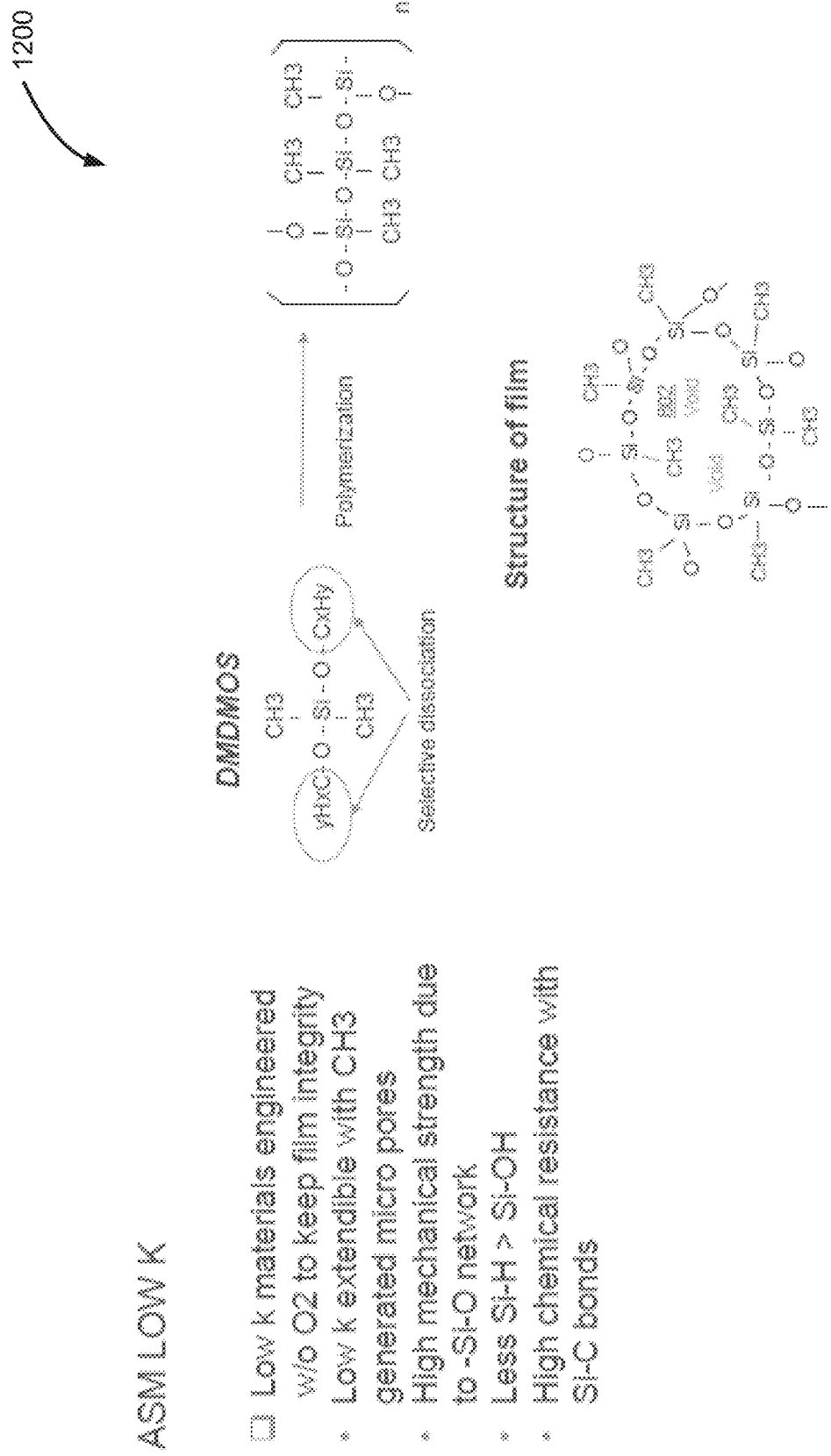
FIG. 12 illustrates an exemplary polymerization process.

FIG. 12 illustrates an exemplary polymerization process for a particular precursor, DMDMOS. As illustrated, the polymerization can occur as a result of selective dissociation of molecule end groups ($C_xH_y$ in the illustrative example). Further, the structure of the a—deposited material or may desirably include voids that form as the material polymerizes. The polymerized material can comprise, consist essentially of or consist of Si, C, O, and H.

Figure 2:
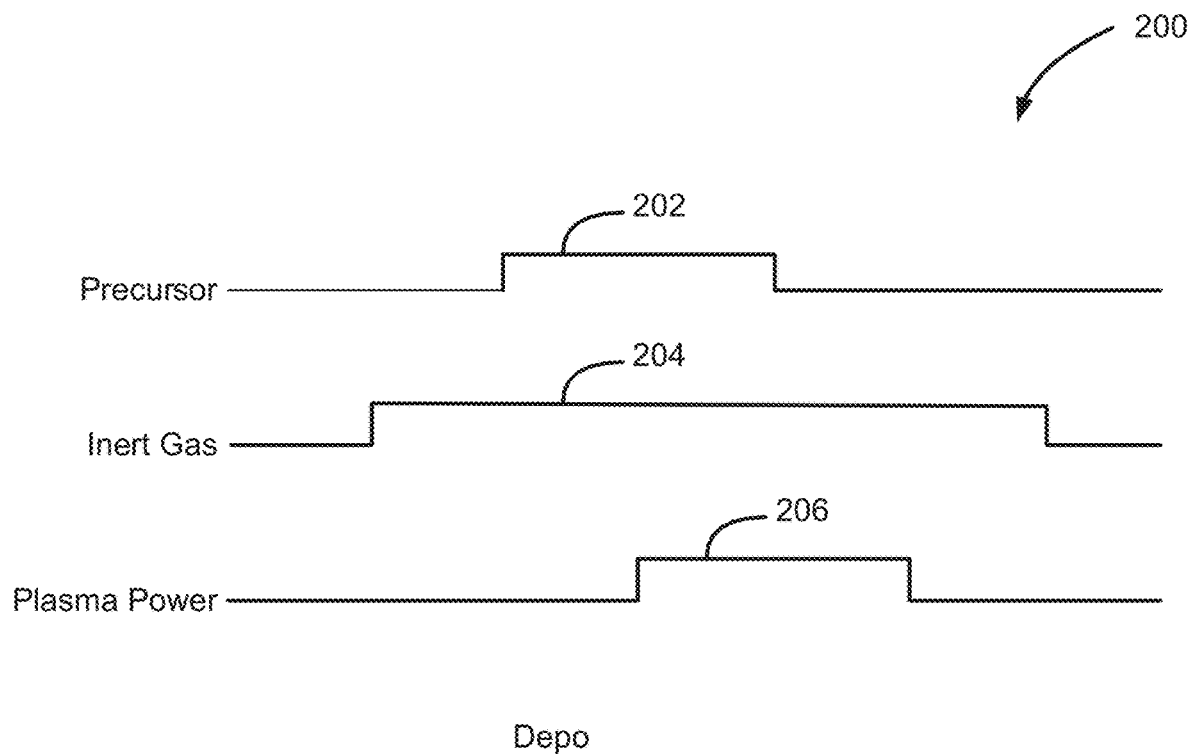
FIG. 2 illustrates a timing sequence suitable for use in accordance with embodiments of the disclosure.

FIG. 2 illustrates a timing sequence diagram 200 of an exemplary method, such as method 100, in accordance with examples of the disclosure. As illustrated, timing sequence 200 can begin with flowing an inert gas such as helium or argon to the reaction chamber for a duration (line 204). The one or more precursors can then be introduced to the reaction chamber for a precursor pulse (line 202). In the illustrated example, after the precursor flow to the reaction chamber has started, a (e.g., first and/or second) power to form the plasma is provided for a duration (line 206). The inert gas flow can continue through the deposition process until after the power to form the plasma is turned off. Further, as illustrated, the (e.g., first and/or second) plasma power can be discontinued after the flow of one or more precursors to the reaction chamber has ceased.

Figure 3:
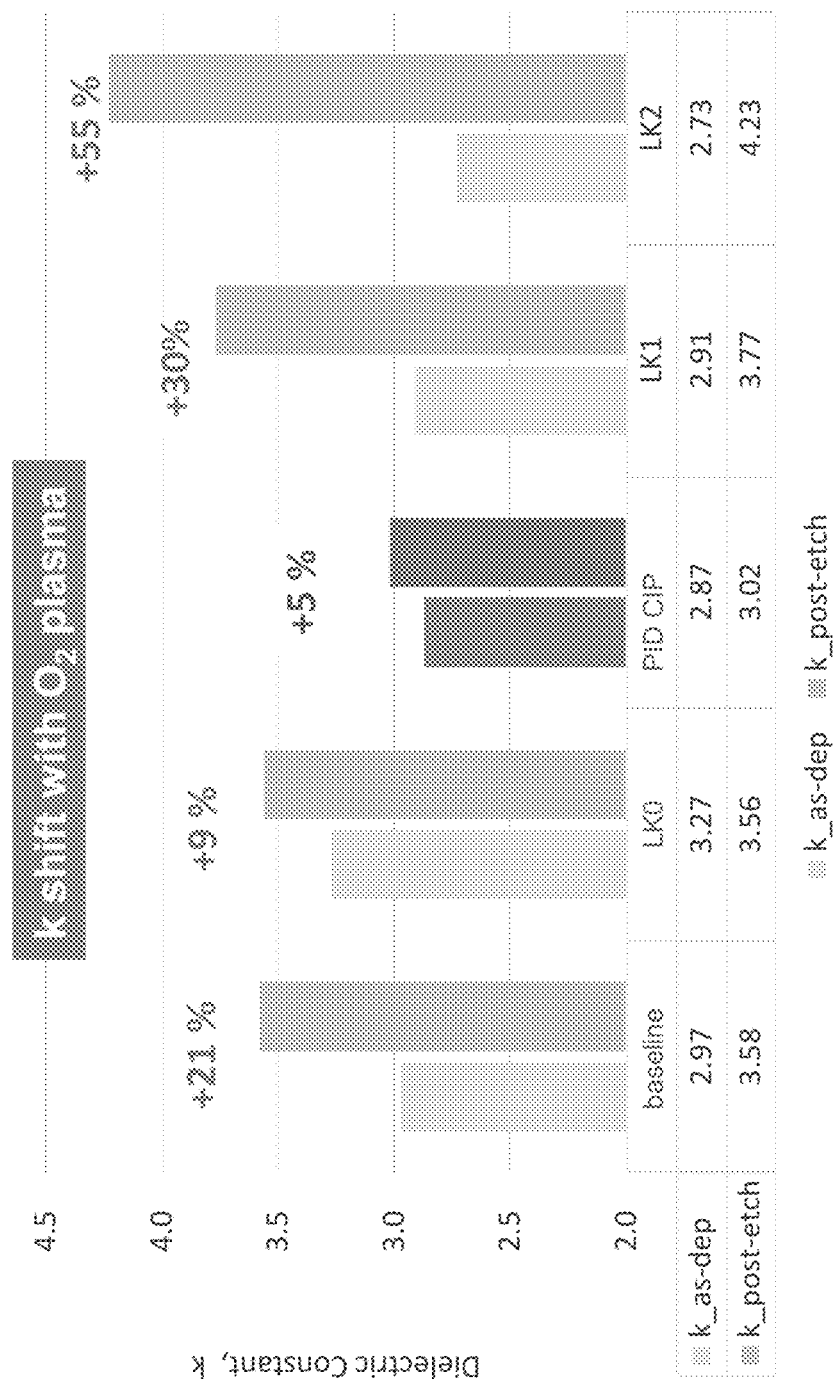
FIG. 3 illustrates dielectric constant shift of layers after exposure to an oxygen plasma in accordance with embodiments of the disclosure.

FIG. 3 illustrates dielectric constant shift between as-deposited dielectric low-k material layers and low-k material layers exposed to a potential-induced degradation (PID) process. The potential-induced degradation process can simulate an oxygen plasma etch process used in subsequent processing steps. An exemplary PID process is described in more detail below in connection with FIG. 9. In FIG. 3, the baseline process used a power of about 2 kW and high frequency plasma power (about 27 MHz). The PID CIP process used higher frequency (about 27 to about 100 MHz) and higher power (over 2 kW to about 5 kW) during the deposition. As illustrated, the PID CIP process exhibited relatively low (about 5 percent) change in the dielectric constant, which as the lowest of the examples illustrated in FIG. 3.

Figure 4:
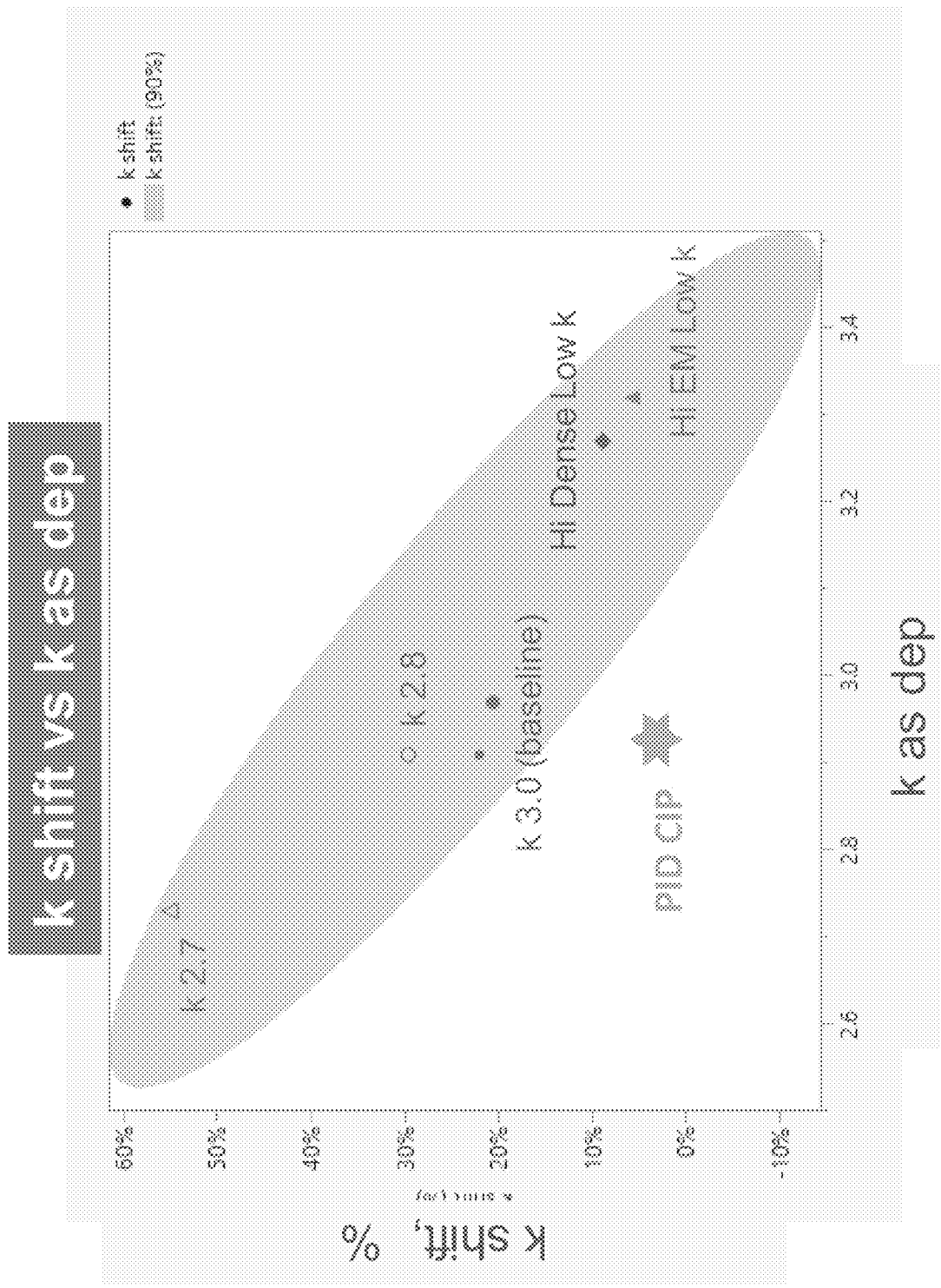
FIG. 4 illustrates dielectric constant shifts versus as-deposited dielectric constants of low-k material layer in accordance with embodiments of the disclosure.

FIG. 4 illustrates dielectric constant shift versus the dielectric constant of the low-k material as deposited. As illustrated, the low-k material deposited with the PID CIP conditions noted herein exhibits a low dielectric constant and a low shift in the dielectric constant.

Figure 5:
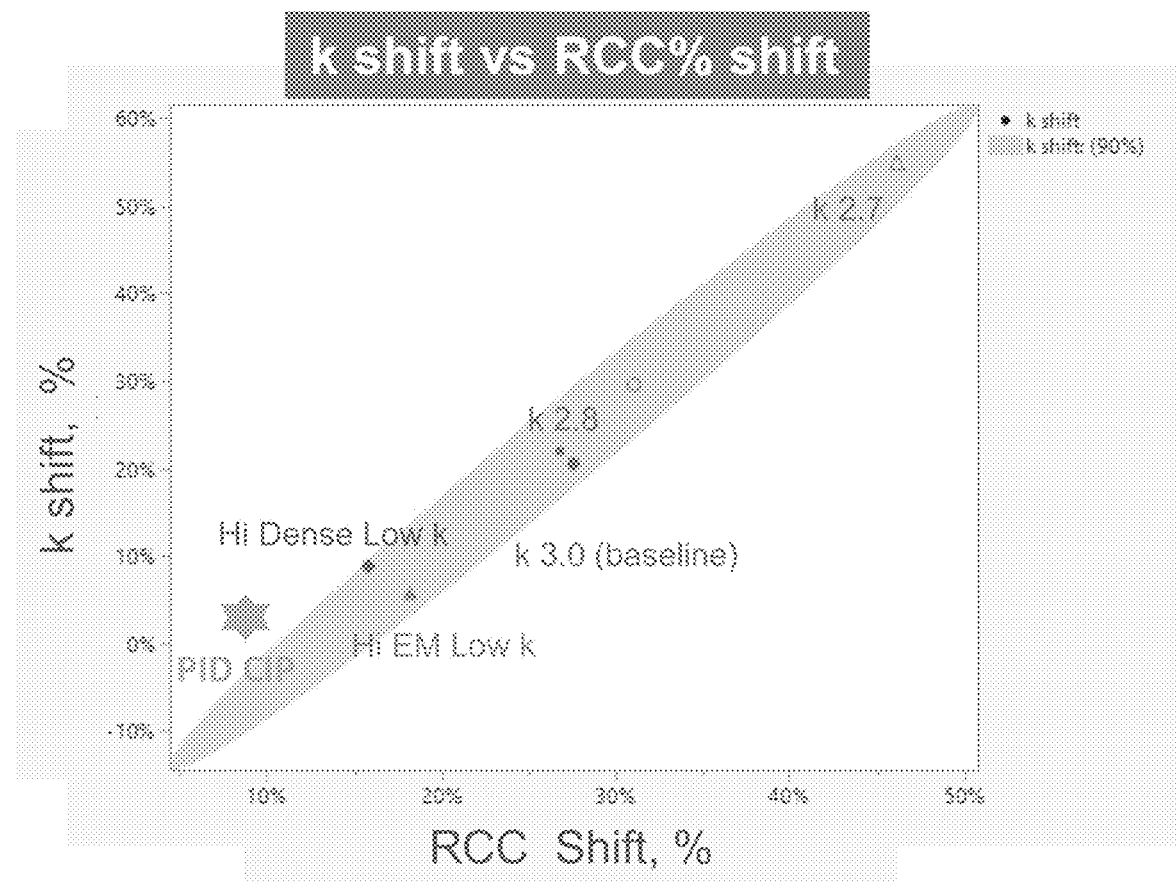
FIG. 5 illustrates dielectric constant shift versus relative carbon concentration shift of low-k material layers in accordance with embodiments of the disclosure.

FIG. 5 illustrates dielectric constant shift versus relative carbon concentration (RCC) shift. As used herein, RCC can be defined as below. The concentrations noted below can be measured, using, for example Fourier-transform infrared spectroscopy (FTIR).

$$\text{Relative Carbon Concentration } (RCC) \% = \frac{Si-(CH_3)_n}{Si-(CH_3)_n + Si-O}$$

As illustrated, the low-k material deposited as described herein (PID CIP) exhibited low dielectric constant shift (less and 10%) and low RCC shift (less than 10%).

Figure 6:
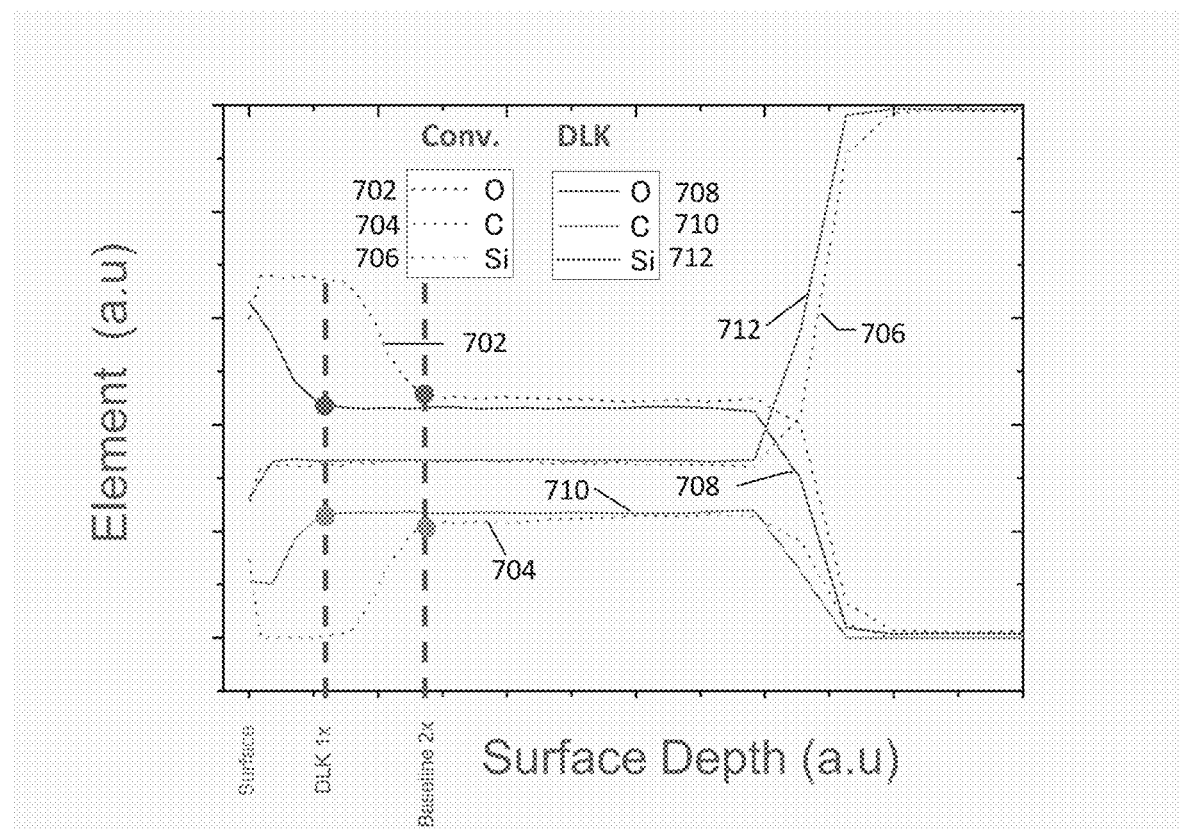
FIG. 6 illustrates potential induced degradation of low-k material layers in accordance with embodiments of the disclosure.

FIG. 6 illustrates PID depth, and specifically oxygen (O), carbon (C), and silicon (Si) concentration versus depth of low-k material for baseline (CONV.) material 702, 704, 706 and dense low-k material formed according to method 100 (DLK) 708, 710, 712. As shown, the DLK material exhibits a shallower PID depth—i.e., the carbon concentration plateaued at a shallower depth for the DLK sample, compared to the Cony. sample.

Figure 7:
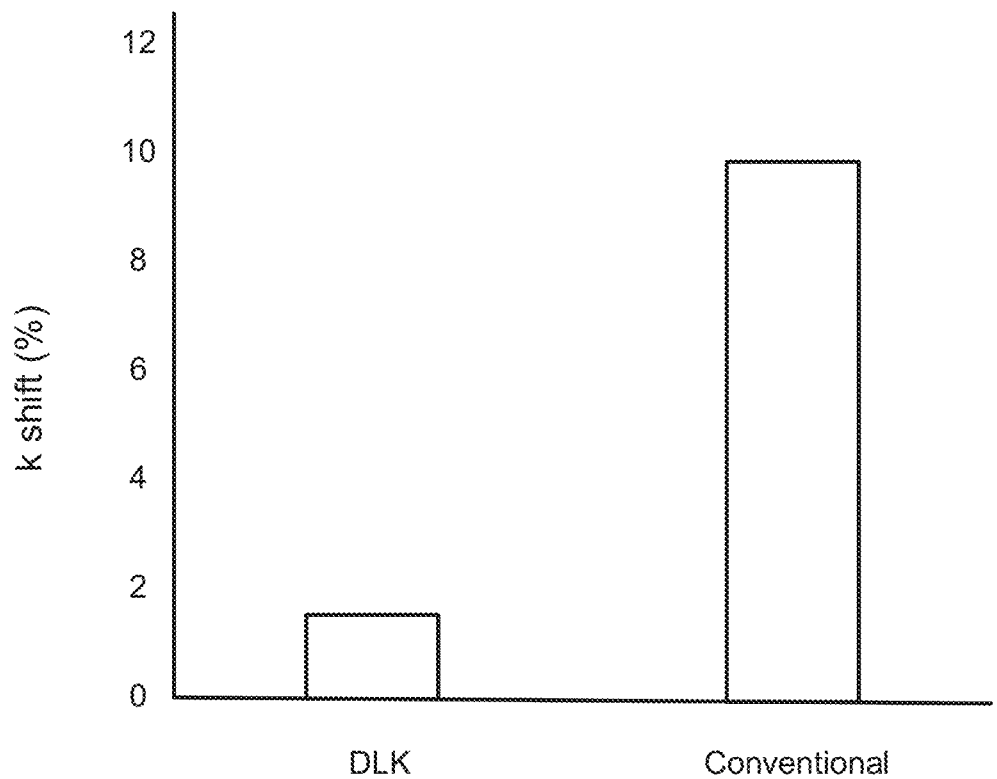
FIG. 7 illustrates dielectric constant shift of low-k material layers in accordance with embodiments of the disclosure.

FIG. 7 illustrates dielectric constant shift for DLK material formed according to method 100 and conventional low-k material—formed using lower frequency power. As illustrated, the dielectric constant shift is much lower (less than 2%), compared to conventional low-k material formed using lower frequency and lower power.

Figure 8:
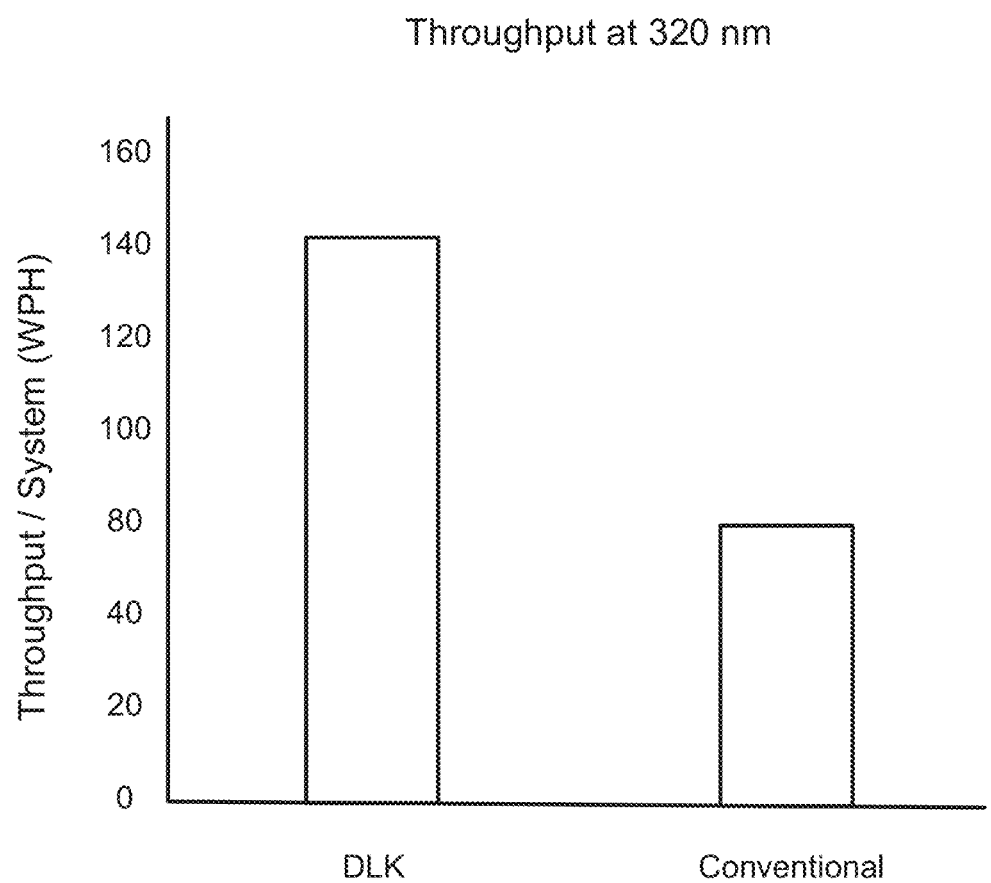
FIG. 8 illustrates exemplary throughput of methods in accordance with examples of the disclosure.

FIG. 8 illustrates processing throughput using method 100 versus a conventional, lower power/lower frequency process. As illustrated, the throughput is higher—e.g., about 140 substrates per hour versus only about 70 substrates per hour for a 320 nm thick layer.

Figure 9:
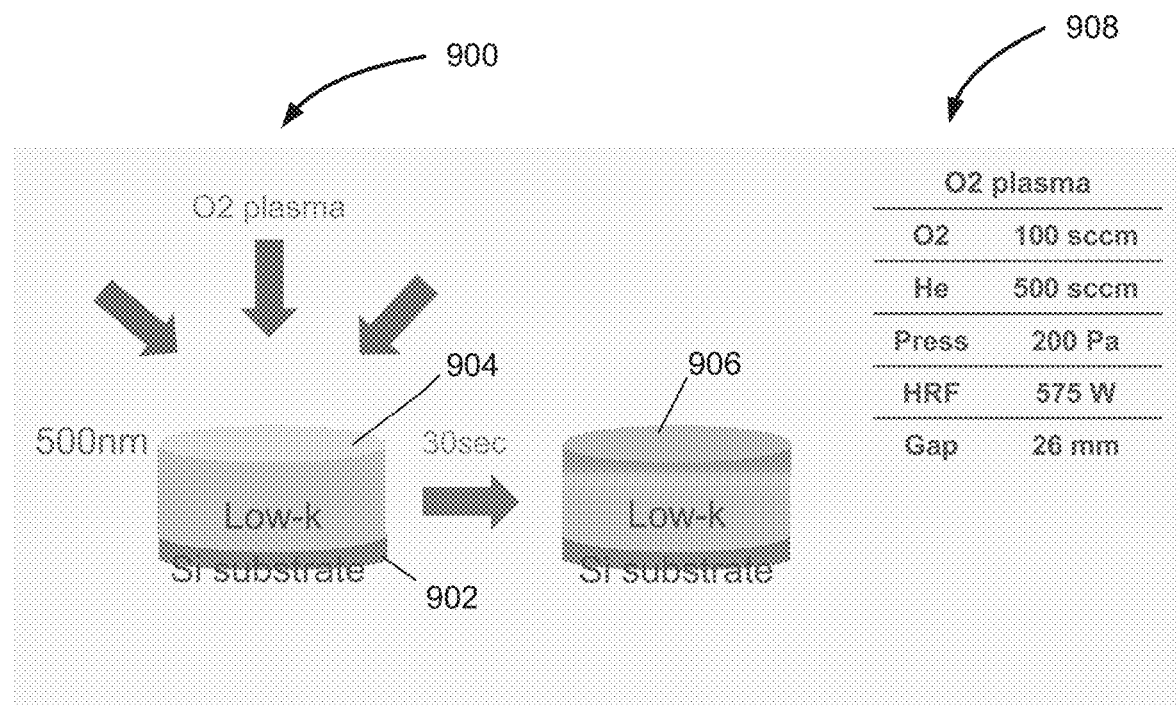
FIG. 9 illustrates a potential induced degradation process in accordance with embodiments of the disclosure.

FIG. 9 illustrates a structure 900 in accordance with examples of the disclosure and a PID process in accordance with additional examples of the disclosure. Structure 900 includes a substrate 902, such as a substrate described herein, and a low-k material layer 904 formed according to method 100. Low-k material layer 904 can exhibit relatively low dielectric constant, low dielectric constant shift, and/or low relative carbon concentration shift or loss, as noted above in connection with layers formed using method 100. For example, the dielectric constant can be less than 3 or between about 2.5 and less than 3. Additionally or alternatively, the dielectric constant can vary by less than 6 percent after exposure to an oxygen plasma—such as during a PID process described above or a similar etch process.

During a PID process, low-k material layer 904 is exposed to activated species from an oxygen (e.g., $O_2$) plasma to form damaged layer 906. Exemplary process conditions for the PID process are provided in table 908.

Figure 10:
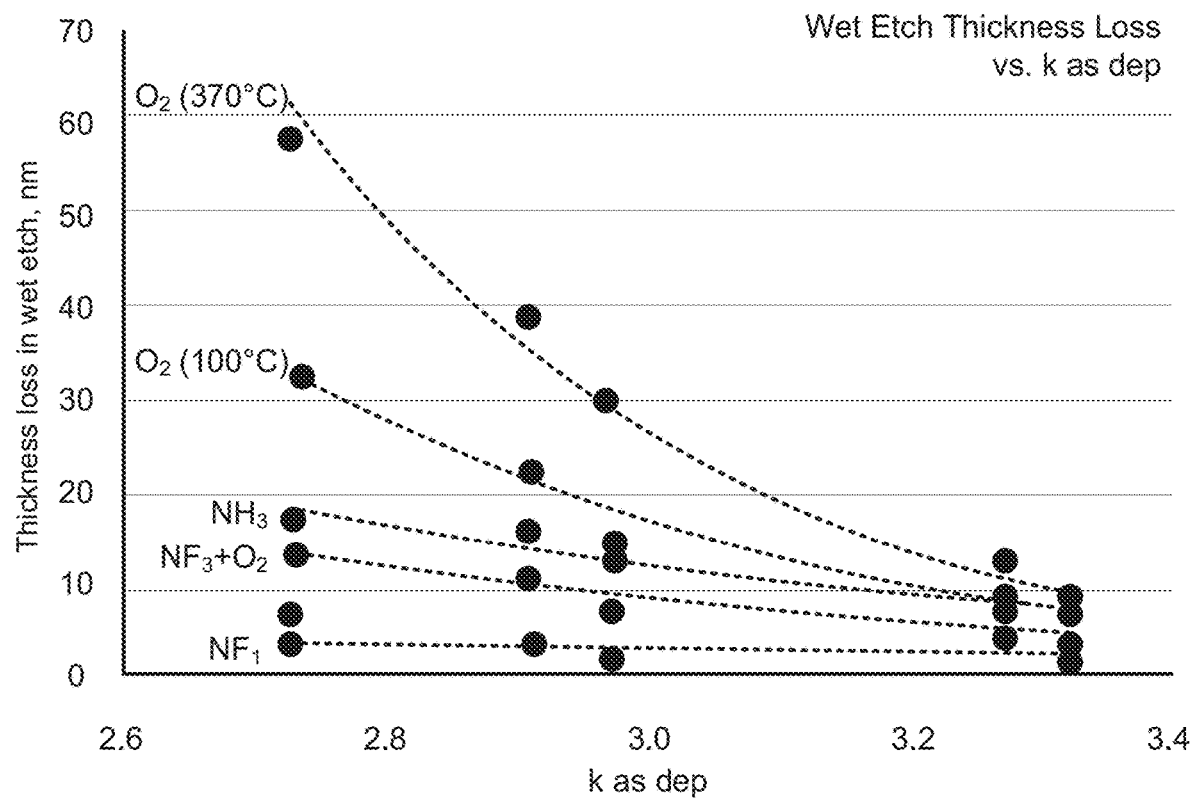
FIG. 10 illustrates wet etch thickness loss versus dielectric constant of low-k material layers in accordance with embodiments of the disclosure.

FIG. 10 illustrates thickness loss in a wet etch for various plasma reactants and temperatures versus the dielectric constant of low-k material deposited using various conditions. As illustrated, the oxygen ($O_2$) plasma at higher temperature (about 370° C.) created the most loss in film thickness and thus was used to characterize PID for examples described herein.

Figure 11:
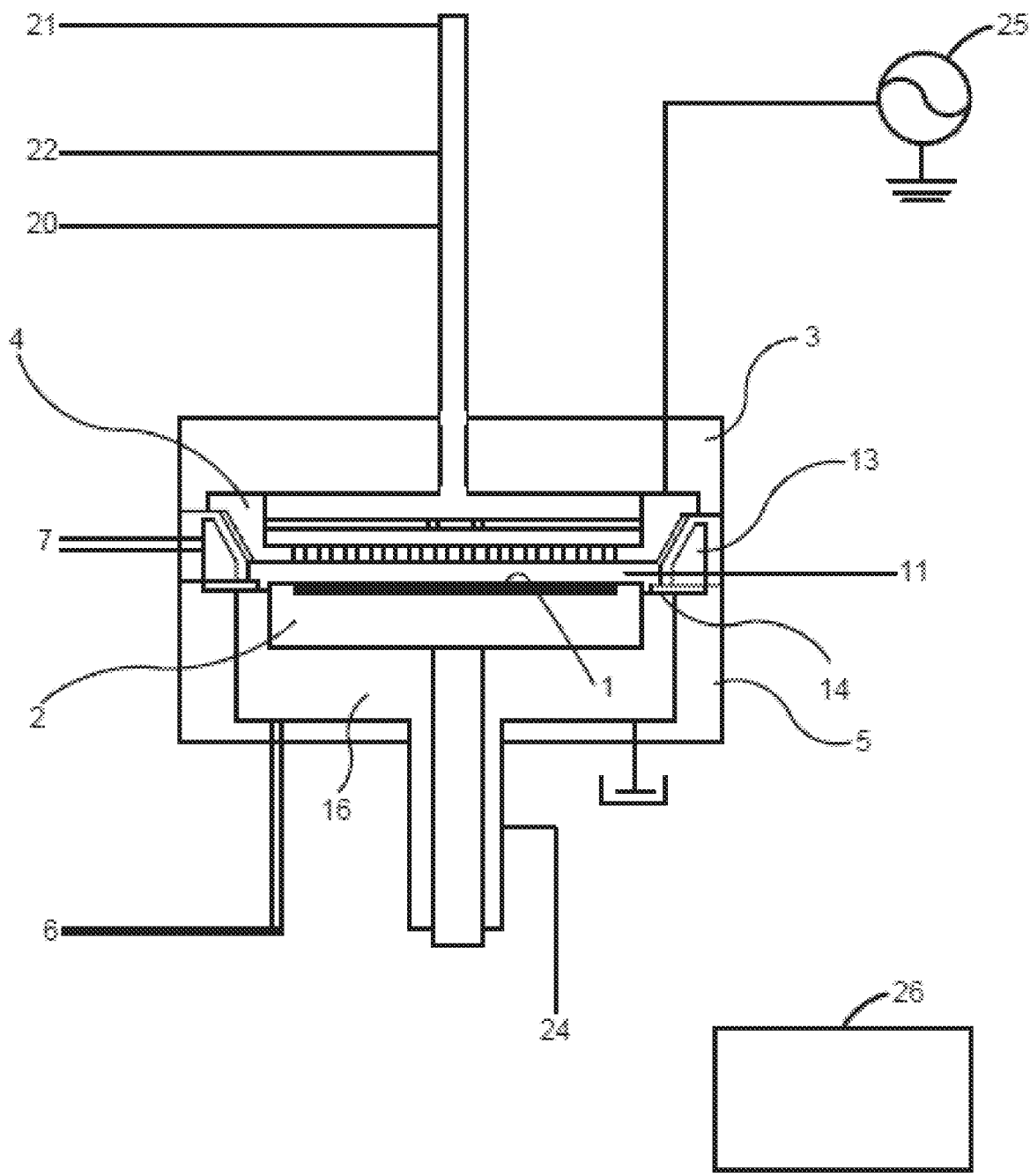
FIG. 11 illustrates a reactor system for forming low-k material layers in accordance with embodiments of the disclosure.

As noted above, exemplary low-k material layers can be formed using a PECVD reactor system, such as reactor system 1100, illustrated in FIG. 11. Reactor system 1100 can be used to perform one or more steps or sub steps as described herein and/or to form one or more structures or portions thereof as described herein.

Reactor system 1100 includes a pair of electrically conductive flat-plate electrodes 4, 2 in parallel and facing each other in the interior 11 (reaction zone) of a reaction chamber 3. A plasma can be excited within reaction chamber 3 by applying, for example, a first and second plasma power as described herein—e.g., using a dual plasma power source. A temperature regulator can be provided in a lower stage 2 (the lower electrode), and a temperature of a substrate 1 placed thereon can be kept at a desired temperature. Electrode 4 can serve as a gas distribution device, such as a shower plate. Inert gas, precursor gas, and/or the like can be introduced into reaction chamber 3 using one or more of a gas line 20, a gas line 21, and a gas line 22, respectively, and through the shower plate 4. Although illustrated with three gas lines, reactor system 1300 can include any suitable number of gas lines.

In reaction chamber 3, a circular duct 13 with an exhaust line 7 is provided, through which gas in the interior 11 of the reaction chamber 3 can be exhausted. Additionally, a transfer chamber 5, disposed below the reaction chamber 3, is provided with a seal gas line 24 to introduce seal gas into the interior 11 of the reaction chamber 3 via the interior 16 (transfer zone) of the transfer chamber 5, wherein a separation plate 14 for separating the reaction zone and the transfer zone is provided (a gate valve through which a wafer is transferred into or from the transfer chamber 5 is omitted from this figure). The transfer chamber is also provided with an exhaust line 6. In some embodiments, the deposition step and any curing step can be performed in the same reaction space, so that two or more (e.g., all) of the steps can continuously be conducted without exposing the substrate to air or other oxygen-containing atmosphere.

In some embodiments, continuous flow of an inert or carrier gas to reaction chamber 3 can be accomplished using a flow-pass system (FPS), wherein a carrier gas line is provided with a detour line having a precursor reservoir (bottle), and the main line and the detour line are switched, wherein when only a carrier gas is intended to be fed to a reaction chamber, the detour line is closed, whereas when both the carrier gas and a precursor gas are intended to be fed to the reaction chamber, the main line is closed and the carrier gas flows through the detour line and flows out from the bottle together with the precursor gas. In this way, the carrier gas can continuously flow into the reaction chamber and can carry the precursor gas in pulses by switching between the main line and the detour line, without substantially fluctuating pressure of the reaction chamber.

A skilled artisan will appreciate that the apparatus includes one or more controller(s) 26 programmed or otherwise configured to cause one or more method steps as described herein to be conducted. The controller(s) are communicated with the various power sources, heating systems, pumps, robotics and gas flow controllers, or valves of the reactor, to effect the methods steps, as will be appreciated by the skilled artisan.

In some embodiments, a dual chamber reactor (two sections or compartments for processing wafers disposed close to each other) can be used, wherein a reactant gas and a noble gas can be supplied through a shared line, whereas a precursor gas is supplied through unshared lines.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method of forming an initially flowable low-k material layer on a surface of a substrate, the method comprising the steps of:
   providing a substrate within a reaction chamber of a reactor system;
   providing one or more precursors to the reaction chamber; and
   providing first plasma power to polymerize the one or more precursors within the reaction chamber to form low-k material,
   wherein a frequency of the first plasma power is between about 27 MHz and about 100 MHz and wherein the first plasma power is greater than 2 kW,
   providing a second plasma power having a frequency of less than 500 kHz, and
   filling a recess on a surface of the substrate with the initially flowable low-k material,
   wherein the second plasma power is less than the first plasma power.

2. The method of claim 1, wherein the first plasma power is between about 2 kW and about 5 kW.

3. The method of claim 1, wherein a temperature within the reaction chamber during the step of providing one or more precursors to the reaction chamber is between about 200° C. and about 450° C. or between about 300° C. and about 400° C.

4. The method of claim 1, wherein a pressure within the reaction chamber during the step of providing one or more precursors to the reaction chamber is between about 1 torr and about 20 torr or between about 2 torr and about 10 torr.

5. The method of claim 1, wherein the step of providing the first plasma power and the step of providing the second plasma power are performed together and wherein the step of providing the first plasma power begins after the step of providing one or more precursors starts and ends before the step of providing one or more precursors ends.

6. The method of claim 1, wherein a frequency of the second plasma power is between about 400 kHz and about 500 kHz.

7. The method of claim 1, wherein the second plasma power is between about 10 W and about 300 W.

8. The method of claim 1, wherein the one or more precursors comprise a compound comprising one or more of Si—C—Si and Si—O—Si bonds.

9. The method of claim 1, wherein the one or more precursors comprise a compound comprising a cyclic structure.

10. The method of claim 9, wherein the cyclic structure comprises silicon.

11. The method of claim 9, wherein the cyclic structure comprises silicon and oxygen.

12. The method of claim 1, wherein the one or more precursors comprise a compound comprising an organosilicon compound.

13. The method of claim 1, wherein the one or more precursors comprise one or more of dimethyldimethoxysilane (DMDMOS), octamethylcyclotetrasiloxane (OMCTS), tetramethylcyclotetrasiloxane (TMCTS), octamethoxydodecasiloxane (OMODDS), octamethoxycyclioiloxane, diethoxymethylsilane (DEMS), dimethoxymethylsilane (DMOMS), phenoxydimethylsilane (PODMS), dimethyldioxosilylcyclohexane (DMDOSH), 1,3-dimethoxytetramethyldisiloxane (DMOTMDS), dimethoxydiphenylsilane (DMDPS), and dicyclopentyldimethoxysilane (DcPDMS).

14. The method of claim 1, wherein at least one of the one or more precursors comprises a ring structure comprising a chemical formula represented by —$(Si(R_1, R_2)$—$O)_n$—, where n ranges from about 3 to about 10.

15. The method of claim 1, wherein at least one of the one or more precursors comprises a linear structure comprising a chemical formula represented by $R_3$—$(Si(R_1, R_2)_m$—$O_{(m-1)})$—$R_4$, where m can range from about 1 to about 7.

16. The method of claim 1, wherein the reactor system comprises a capacitively coupled plasma (CCP) reactor.

17. A reactor system comprising:
a reaction chamber;
a precursor source coupled to the reaction chamber;
an inert gas source coupled to the reaction chamber;
a vacuum source coupled to the reaction chamber; and
a controller configured to operate at least one plasma power source to provide a plasma first power of between about 2 kW and about 5 kW with a power frequency between about 27 MHz and about 100 MHz and a second plasma power of between about 10 W and about 300 W with a power frequency between about 400 Hz and about 500 Hz to form an initially flowable low-k material layer on a surface of a substrate.

\* \* \* \* \*